United States Patent [19]
Imai et al.

[11] Patent Number: 5,702,872
[45] Date of Patent: Dec. 30, 1997

[54] PROCESS FOR RESIST PATTERN FORMATION USING POSITIVE ELECTRODEPOSITION PHOTORESIST COMPOSITIONS

[75] Inventors: Genji Imai; Naozumi Iwasawa, both of Hiratsuka; Tsuguo Yamaoka, Funabashi, all of Japan

[73] Assignee: Kansai Paint Co., Ltd., Hyogo, Japan

[21] Appl. No.: 610,237

[22] Filed: Mar. 4, 1996

Related U.S. Application Data

[62] Division of Ser. No. 233,443, Apr. 26, 1994, Pat. No. 5,527,656.

[30] Foreign Application Priority Data

| Apr. 27, 1993 | [JP] | Japan | 5-125499 |
| Apr. 27, 1993 | [JP] | Japan | 5-125500 |
| Apr. 27, 1993 | [JP] | Japan | 5-125501 |

[51] Int. Cl.$^6$ .................................................. G03F 7/027
[52] U.S. Cl. .................. 430/326; 430/325; 430/330; 430/270.1; 430/287.1; 430/288.1; 430/919; 430/921
[58] Field of Search ................. 430/325, 270.1, 430/288.1, 287.1, 919, 921, 326, 330

[56] References Cited

U.S. PATENT DOCUMENTS

| 5,364,738 | 11/1994 | Kondo et al. | 430/283 |
| 5,384,229 | 1/1995 | Pai et al. | 430/270 |

FOREIGN PATENT DOCUMENTS 0 284 868  10/1988  European Pat. Off.

OTHER PUBLICATIONS

Moon et al., Chem. Mater. 1993, vol. 5, No. 9, pp. 1315–1320.

*Primary Examiner*—George F. Lesmes
*Assistant Examiner*—Cheryl Juska
*Attorney, Agent, or Firm*—Wenderoth, Lind & Ponack

[57] ABSTRACT

A positive type electrodeposition photoresist composition includes, as essential components: (A) 100 parts by weight of a polymer having carboxyl group(s) in an amount of 0.5 to 10 equivalents per kg of said polymer and optionally having hydroxyphenyl group(s) in an amount of at least 1 equivalent per kg of the polymer, or (A') a carboxyl group-containing polymer and (A") a hydroxy-phenyl group-containing polymer; (B) 5 to 150 parts by weight of a compound having at least 2 vinyl ether groups in the molecule; and (C) 0.1 to 40 parts by weight per 100 parts by weight of the total of polymer (A), or the polymer (A') and the polymer (A"), and the vinyl ether group-containing compound (B), which generates an acid when irradiated with an actinic ray. The composition is dissolved or dispersed in an aqueous medium by neutralizing the carboxyl group(s) in the polymer (A) or (A') with a basic compound. The positive type electrodeposition photoresist composition allows the forming of a fine image pattern at high resolution. A process for a resist pattern formation using such a composition is also disclosed.

44 Claims, No Drawings

PROCESS FOR RESIST PATTERN FORMATION USING POSITIVE ELECTRODEPOSITION PHOTORESIST COMPOSITIONS

This application is a division of application Ser. No. 08/233,443, filed Apr. 26, 1994 (now U.S. Pat. No. 5,527, 656).

The present invention relates to positive type electrodeposition photoresist compositions, as well as to processes for resist pattern formation using the compositions.

In accordance with developments of higher density circuit patterns as well as down-sizing of through holes for printed wiring boards, it has been increasingly desired to increase resolution of circuit patterns and improve reliability in formation of through holes. For this purpose, attention is focused on positive type electrodeposition photoresists.

Currently, various positive type electrodeposition photoresists have been proposed which include a solution or dispersion in water of a composition comprising a resin that can be dissolved or dispersed in water by neutralization and a quinone diazide compound as a photosensitizer, or a solution or dispersion in water of a resin that can be dissolved or dispersed in water by neutralization and that has chemically bonded thereto a quinone diazide compound.

These compositions are prepared utilizing a reaction in which the quinone diazide is photo-decomposed when irradiated with an ultraviolet light and forms an indenecarboxylic acid via a ketone.

The use of the photoresist compositions containing a quinone diazide group, however, invites lower photosensitivity, longer exposure time, and, hence, reduced work efficiency. The quinone diazide group is unstable in aqueous systems and, hence, there is a difficulty in using the composition containing a quinone diazide group in applications that require prolonged stability of the composition in a bath as in the electrodeposition coating processes.

The resist film prepared from the above composition is developed by utilizing the difference in solubility between exposed portions and unexposed portions, and the development must be made under strictly controlled conditions in order to obtain good reproducibility because the film-formable component itself is dissolved or dispersed in the aqueous solution of a basic compound which solution is a developer in nature and, hence, conditions for the development are subtle. Since the unexposed portions of the resist film are not completely insoluble in the developer, the unexposed portions are partly dissolved or cause swelling during the development step, resulting in that the pattern formed has lower resistance to the etchant used and tends to have lower precision.

It is a main object of the present invention to provide a novel positive type electrodeposition photoresist composition that can obviate the disadvantages of the conventional positive type electrodeposition photoresist using the quinone diazide group-containing compound or resin as the photosensitizer, as well as a novel process for forming a resist pattern using such a composition.

The present inventors made a study on the elimination of the above-mentioned drawbacks of the conventional positive type photosensitive electrodeposition compositions. As a result, the present inventors have newly found that an electrodeposition composition comprising a polymer having carboxyl group(s) and optionally phenolic hydroxyl group (s), a compound having a plurality of vinyl ether groups and a compound which is decomposed and generates an acid when irradiated with an actinic ray, and a composition comprising a polymer having carboxyl group(s), a polymer having hydroxyphenyl group(s), a compound having a plurality of vinyl ether groups and a compound which is decomposed and generates an acid when irradiated with an actinic ray, each provide a photosensitive composition which functions in a novel mechanism as follows. That is, the coating film formed with each of the compositions, when heated, gives rise to an addition reaction between (a) the carboxyl group(s) and the hydroxyphenyl group(s) and (b) the vinyl ether groups and generates a crosslinked structure which is insoluble in solvents and aqueous alkaline solutions; this crosslinked structure, when irradiated with an actinic ray and then heated, is severed by the catalytic action of the acid generated by the irradiation and, as a result, the exposed portions of the coating film becomes again soluble in solvents or aqueous alkaline solutions. The finding has led to the completion of the present invention.

According to the first aspect of the present invention, there is provided a positive type electrodeposition photoresist composition comprising, as essential components:

(A) 100 parts by weight of a polymer having carboxyl group(s) in an amount of 0.5 to 10 equivalents per kg of the polymer and optionally having hydroxyphenyl group(s) in an amount of at least 1 equivalent per kg of the polymer;

(B) 5 to 150 parts by weight of a compound having at least 2 vinyl ether groups per molecule; and (C) 0.1 to 40 parts by weight, per 100 parts by weight of the sum of polymer (A) and the vinyl ether group-containing compound (B), of a compound which generates an acid when irradiated with an actinic ray, said composition being dissolved or dispersed in an aqueous medium by neutralizing the carboxyl group(s) in the polymer (A) with a basic compound; as well as a process for pattern formation using such a composition.

Further, according to the second aspect of the present invention, there is provided a positive type electrodeposition photoresist composition comprising, as essential components:

(A') a polymer having carboxyl group(s);

(A") a polymer having hydroxyphenyl group(s);

(B) 5 to 150 parts by weight, per 100 parts by weight of the sum of the polymer (A') and the polymer (A"), of a compound having at least 2 vinyl ether groups per molecule;

(C) 0.1 to 40 parts by weight, per 100 parts by weight of the sum of the polymer (A'), the polymer (A") and the compound (B), of a compound which generates an acid when irradiated with an actinic ray, said composition being dissolved or dispersed in an aqueous medium by neutralizing the carboxyl group(s) in the polymer (A) with a basic compound, wherein the proportion by weight of the polymer (A')/polymer (A") is within the range of 90/10 to 10/90, the carboxyl group content in a mixture consisting of the components (A'), (A"), (B) and (C) is within the range of 0.5 to 5 equivalents per kg of the mixture, and the content of hydroxyphenyl group in the mixture is within the range of 0.5 to 7 equivalents per kg of the mixture;

as well as a process for pattern formation using such a composition.

In the resist film formed with the composition of the present invention, the unexposed portions of the coating film form a crosslinked structure and becomes completely insoluble in the developer used in development, and thus causes no dissolution or swelling during the development.

Therefore, the use of the composition of the present invention eliminates the problems as encountered in conventional positive type electrodeposition resist.

Further, the composition of the present invention can have high transparency to actinic rays because they need sot contain a large amount of a functional group of high extinction coefficient unlike resists using quinone diazide group-containing compound or resin as a photosensitizer. Also, the compositions of the present invention can have high sensitivity as a positive type photoresist because they generate an acid when irradiated with an actinic ray and the acid, when heated, acts as a catalyst to sever the formed crosslinked structure in the exposed portions of the resist film in the form of a chain reaction.

Furthermore, the compositions of the present invention can form a pattern of very high contrast and, consequently, are very useful as a resist for formation of fine pattern.

Also, the compositions of the present invention are very stable in aqueous systems since they contain no groups which are unstable in aqueous systems such as a quinone diazide group, and, hence, they can form a film having high reliability for a long time by an electrodeposition coating process.

The present invention is hereinafter described in more detail.

(A) Polymer having carboxyl group(s) and optionally having hydroxyphenyl group(s)

The polymer (A) used in the composition according to the first aspect of the present invention is a film-forming polymer having at least one carboxyl group and optionally having at least one hydroxyphenyl group per molecule. The polymers containing only carboxyl group(s) include, for example, homopolymers of a carboxyl group-containing polymerizable unsaturated monomer; copolymers of the carboxyl group-containing monomer with another monomer copolymerizable therewith; a resin of polyester type, polyurethane type, polyamide type or other type having carboxyl group(s) in the molecular chain or at the molecular end(s). The polymer having both carboxyl group(s) and hydroxyphenyl group(s) includes, for example, copolymers of a carboxyl group-containing polymerizable unsaturated monomer and a hydrostyrene monomer; copolymers of a carboxyl group-containing monomer, a hydroxystyrene monomer and an other copolymerizable monomer; and phenol resins obtained by reacting hydroxybenzoic acids, gallic acid, resorcylic acid, etc., or mixtures of them with phenol, $C_1$–$C_{18}$ mono- or dialkyl substituted, phenol, naphthols, resorcinol or catechol, etc., with formaldehyde.

The carboxyl group-containing polymerizable unsaturated monomer includes, for example, acrylic acid, methacrylic acid, crotonic acid and itaconic acid. The other monomer copolymerizable with these carboxyl group-containing monomers and/or hydroxystyrene monomers includes, for example, $C_1$–$C_{12}$ alkyl esters of (meth)acrylic acid, such as methyl (meth)acrylate, ethyl (meth)acrylate, propyl (meth)acrylate, butyl (meth)acrylate, hexyl (meth)acrylate, octyl (meth)acrylate, 2-ethylhexyl (meth)acrylate, nonyl (meth)acrylate, decyl (meth)acrylate and the like; $C_2$–$C_6$ hydroxyalkyl esters of (meth)acrylic acid, such as hydroxyethyl (meth)acrylate, 2-hydroxypropyl (meth)acrylate, 3-hydroxypropyl (meth)acrylate, hydroxybutyl (meth)acrylate and the like; vinyl aromatic compounds such as styrene, α-methylstyrene, p-tert-butylstyrene and the like; vinyl acetate; (meth)acrylonitrile; (meth)acrylamide; and vinylpyrrolidone. These monomers can be used singly or in combination of two or more.

In particular, it is preferred to use as the other monomer vinyl aromatic compounds such as $C_1$–$C_6$ alkyl-substituted styrenes (e.g., p-tert-butylstyrene), etc. in view of the precision of image patterns formed, etching resistance and the like.

The polymer (A) having carboxyl group(s) and optionally having hydroxyphenyl group(s) preferably has a number-average molecular weight of generally about 500 to about 100,000, particularly about 1,500 to about 30,000. In the polymer (A), the desirable carboxyl group content is generally 0.5 to 10 equivalents, particularly 0.6 to 7 equivalents, and more particularly 0.7 to 5 equivalents, per kg of the polymer (A). When the carboxyl group content is less than 0.5 equivalent/kg of the polymer (A), the film formed by heating before irradiation with an actinic ray has no sufficient crosslinking degree, resulting in low developability, and the composition tends to have low solubility or dispersability in water, resulting in insufficient stability of the composition in a fluid state. On the other hand, when the carboxyl group content is more than 10 equivalent/kg of the polymer (A), the work efficiency of electrodeposition coating using composition tends to be lowered.

In the case where the polymer (A) further contains hydroxyphenyl group(s), it is preferred that the hydroxyphenyl group content of the composition be at least 1 equivalent, particularly 1.5 to 10 equivalents, and more particularly 2 to 8 equivalents, per kg of the polymer (A) in view of etching resistance and precision of image patterns to be formed. When the hydroxyphenyl group content is less than 1 equivalent per kg of the polymer (A), no sufficient crosslinking may be obtained.

Further, the polymer (A) preferably has a glass transition temperature (Tg) of not lower than 0° C., particularly 0° to 100° C., and more particularly 5° to 70° C. When the glass transition temperature is lower than 0° C., the resulting coating film is sticky and easily picks up dirt and dust, there being the possibility that the handling becomes difficult.

(A') Polymer having carboxyl group(s)

The polymer (A') used in the photosensitive composition according to the second aspect of the present invention is a film-formable polymer having at least one carboxyl group in the molecule. Examples of the polymer (A') are a homopolymer of a carboxyl group-containing polymerizable unsaturated monomer; a copolymer of said carboxyl group-containing monomer and other copolymerizable monomer; and a resin of polyester type, polyurethane type, polyamide type or other type having carboxyl group(s) in the molecular chain or at the molecular end(s).

The carboxyl group-containing polymerizable unsaturated monomer includes, for example, acrylic acid, methacrylic acid, crotonic acid and itaconic acid. The other monomer copolymerizable with the carboxyl group-containing monomer includes, for example, $C_1$–$C_{12}$ alkyl esters of (meth)acrylic acid, such as methyl (meth)acrylate, ethyl (meth)acrylate, propyl (meth)acrylate, butyl (meth) acrylate, hexyl (meth)acrylate, octyl (meth)acrylate, 2-ethylhexyl (meth)acrylate, nonyl (meth)acrylate, decyl (meth)acrylate and the like; $C_2$–$C_6$ hydroxyalkyl esters of (meth)acrylic acid, such as hydroxyethyl (meth)acrylate, 2-hydroxypropyl (meth)acrylate, 3-hydroxypropyl (meth) acrylate, hydroxybutyl (meth)acrylate and the like; vinyl aromatic compounds such as styrene, α-methylstyrene, p-tert-butylstyrene and the like; vinyl acetate; (meth)acrylonitrile; (meth)acrylamide; and vinylpyrrolidone. These monomers can be used singly or in combination of two or more. Among said other monomers, preferable are vinyl aromatic compounds such as styrene, α-methylstyrene, $C_1$–$C_6$ alkyl-substituted styrenes (e.g., p-tert-butylstyrene) and the like, in view of the precision of image pattern formed, etching resistance, etc.

The carboxyl group-containing polymer (A') preferably has a number-average molecular weight of generally about 3,000 to about 100,000, particularly about 5,000 to about 30,000. In the polymer (A), the desirable carboxyl group content is generally 0.5 to 10 equivalents, particularly 0.5 to 7 equivalents, and more particularly 0.5 to 5 equivalents, per kg of the polymer (A'). When the carboxyl group content is less than 0.5 equivalent/kg of the polymer (A'), the film formed by heating before irradiation with an actinic ray has no sufficient crosslinking degree and the exposed portions tend to have low developability in alkaline developers, resulting in low developability, and the composition tends to have low solubility or dispersibility in water, resulting in insufficient stability of the composition in a fluid state. On the other hand, when the carboxyl group content is more than 10 equivalents/kg of the polymer (A), the work efficiency of electrodeposition coating using the composition tends to be lowered.

Further, the polymer (A') preferably has a glass transition temperature (Tg) of not lower than 0° C., particularly 0° to 100° C., and more particularly 5° to 70° C. When the glass transition temperature is lower than 0° C., the resulting coating film is sticky and easily picks up dirt and dust, there being the possibility that the handling becomes difficult.

(A") Polymer having hydroxyphenyl group(s)

The polymer (A") used in combination with the above-described polymer (A') in the composition according to the second aspect of the present invention is a polymer having at least one hydroxyphenyl group in the molecule. Examples of the polymer (A") are a condensation product of (a) a monofunctional or polyfunctional phenol compound, an alkylphenol compound of their mixture and (b) a carbonyl compound such as formaldehyde, acetone or the like; a homopolymer of a hydroxyl group-containing vinyl aromatic compound such as p-hydroxystyrene or the like; and a copolymer of said hydroxyl group-containing vinyl aromatic compound and other copolymerizable monomer.

The monofunctional or polyfunctional phenol compound includes, for example, compounds each having 1–3 hydroxyl groups on the benzene ring, such as phenol, o-cresol, m-cresol, p-cresol, 3,5-xylenol, 2,6-xylenol, 2,4-xylenol, catechol, resorcin, pyrogallol, bisphenol A and the like. The alkylphenol compound includes alkylphenol compounds whose alkyl moieties each has 1–10 carbon atoms, preferably 1–4 carbon atoms, such as p-isopropylphenol, p-tert-butylphenol, p-tert-amylphenol, p-tert-octylphenol and the like.

The condensation reaction between these compounds and the carbonyl compound such as formaldehyde, acetone or the like can be conducted by a per se known method. In general, condensation in the presence of an alkali catalyst gives a resole type phenolic resin which becomes insoluble and infusible with the progress of condensation; and condensation using an acid catalyst gives a novolac type product which is soluble and fusible. In the present invention, the latter novolac type phenolic resin can be used preferably. While novolac type phenolic resins increase the molecular weight with the progress of condensation, a novolac type phenolic resin having a molecular weight of 500–2,000, is generally obtained by conducting condensation for 1–3 hours.

As the other monomer copolymerizable with the hydroxyl group-containing vinyl aromatic compound, there can be used the same other copolymerizable monomers as mentioned with respect to the copolymer used as the polymer (A').

The hydroxyphenyl group-containing polymer (A") preferably has a number-average molecular weight of generally about 500 to about 100,000, particularly about 1,000 to about 30,000.

In the polymer (A"), the preferably hydroxyphenyl group content is generally 1.0–10 equivalents, particularly 2–8 equivalents, and more particularly 4 to 8 equivalents, per kg of the polymer (A"). When the hydroxylphenyl group content is less than 1.0 equivalent/kg of the polymer (A"), the film formed by heating before irradiation with an actinic ray tends to have insufficient crosslinking degree and, when the content is more than 10 equivalents/kg of the polymer (A"), the resist film tends to be fragile.

The polymer (A"), similarly to the polymer (A'), preferably has a glass transition temperature (Tg) of not lower than 0° C., particularly 0° to 100° C., and more particularly 5°–70° C. When the Tg is lower than °C., the resulting coating film is sticky and easily picks up dirt and dust, often making the handling difficult.

The polymers (A') and (A") may be used in proportions by weight, (A')/(A"), of generally 90/10 to 10/90, preferably 70/30 to 30/70, and more preferably 60/40 to 40/60. It is desirable to adjust the carboxyl group content and the hydroxyphenyl content in the polymer so that the carboxyl group content can be generally 0.5 to 5 equivalents, preferably 0.6 to 4 equivalents, and more preferably 0.7 to 3 equivalents, per kg of the sum of the components (A'), (A") (B) and (C), and the hydroxyphenyl group content can be generally 0.5 to 7 equivalents, preferably 1 to 5 equivalents, and more preferably 1.5 to 3 equivalents, per kg of the sum of the components (A'), (A"), (B) and (C).

(B) Compound having at least two vinyl ether groups in the molecule

The compound (B) is a low-molecular weight or high-molecular weight compound having, in the molecule, at least two, preferably two to four vinyl ether groups each represented by general formula —R—O—CH=CH$_2$ wherein R represents a C$_1$–C$_6$ straight-chain or branched chain alkylene group such as ethylene, propylene, butylene or the like. Examples of the compound (B) are condensation products between (1) a polyphenol compound (e.g., bisphenol A, bisphenol F, bisphenol S or a phenolic resin) or a polyol (e.g., ethylene glycol, propylene glycol, trimethylolpropane, trimethylolethane, or pentaerythritol) and (2) a halogenated alkyl vinyl ether (e.g., chloroethyl vinyl ether), and reaction products between a polyisocyanate (e.g., tolylene diisocyanate, xylylene diisocyanate, hexamethylene diisocyanate or isophorone diisocyanate) and a hydroxyalkyl vinyl ether (e.g., hydroxyethyl vinyl ether). Among these, condensation products between a polyphenol compound and a halogenated alkyl vinyl ether, and reaction products between a polyisocyanate compound having an aromatic ring and a hydroxyalkyl vinyl ether are particularly preferable in view of etching resistance, precision of pattern formed, etc.

Preferably, the compound (B) is a liquid at normal temperature, or has a melting or softening point of not higher than 150° C., particularly not higher than 130° C. The reason is that such a compound (B) can easily migrate into the polymer (A) or into the polymer (A') and/or the polymer (A") at the heating step before irradiation with an actinic ray and the carboxyl group(s) and/or the phenolic hydroxyl group(s) in said polymers can easily give rise to an addition reaction with the vinyl ether groups in the compound (B).

(C) Compound which generates an acid when irradiated with an actinic ray

The compound (C) is a compound which, when irradiated with an actinic ray (described later), is decomposed and generates an acid having an intensity sufficient to serve the crosslinked structure formed between the polymer (B) and the polymer (A) or the polymer (A') and/or the polymer (A"). [Hereinafter, the compound (C) is referred to as "photochemically-acid-generating compound" in some cases.] The compound (C) includes, for example, the compounds represented by the following formulae (I) to (XIV).

 (I)

wherein Ar represents an aryl group such as phenyl or the like; and $X^{\ominus}$ represents $PF_6^{\ominus}$, $SbF_6^{\ominus}$ or $AsF_6^{\ominus}$,

 (II)

wherein Ar and $X^{\ominus}$ have the same definitions as above,

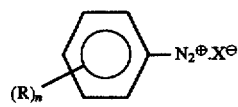 (III)

wherein R represents an alkyl group of 1–12 carbon atoms or an alkoxy group of 1–12 carbon atoms; n represents 0–3; and $X^{\ominus}$ has the same definition as above,

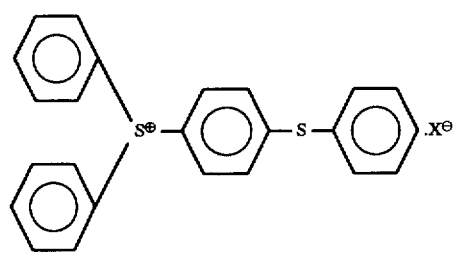 (IV)

wherein $X^{\ominus}$ has the same definition as above,

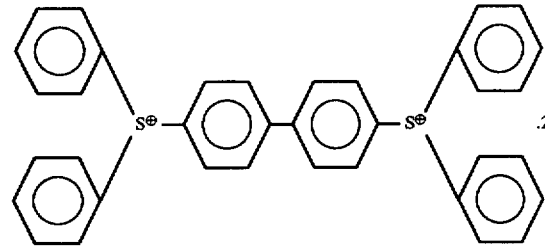 (V)

wherein $X^{\ominus}$ has the same definition as above,

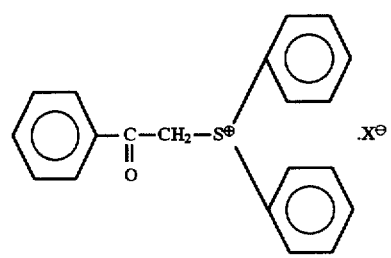 (VI)

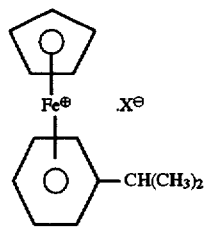 (VII)

wherein $X^{\ominus}$ has the same definition as above,

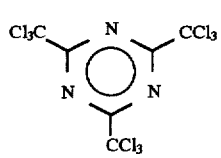 (VIII)

wherein $X^{\ominus}$ has the same definition as above,

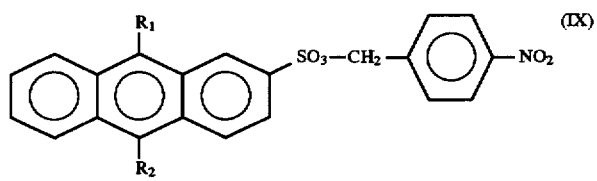 (IX)

wherein $R_1$ and $R_2$ independently represent an alkyl group of 1–12 carbon atoms or an alkoxy group of 1–12 carbon atoms,

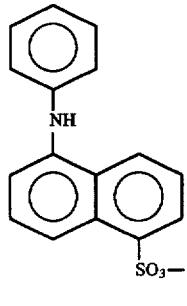 (X)

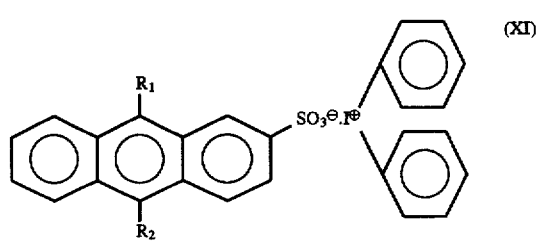 (XI)

wherein $R_1$ and $R_2$ have the same definitions as above.

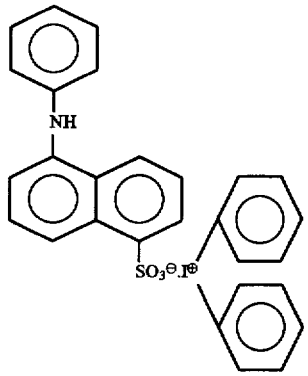

(XII)

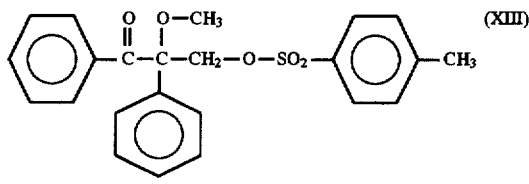

(XIII)

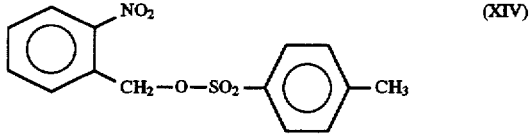

(XIV)

Electrodeposition Photoresist Composition

The electrodeposition photoresist composition according to the first aspect of the present invention is a composition which comprises, as essential components, the above-mentioned three components, i.e., the polymer (A) having carboxyl group(s) and optionally having hydroxyphenyl group(s); the compound (B) having vinyl ether groups; and the photochemically-acid-generating compound (C), and which is dissolved or dispersed in an aqueous medium after the carboxyl group(s) in the polymer (A) is neutralized with a basic compound. The compounding ratio of the three components in the composition can be varied over a wide range depending upon the applications of the composition, etc. However, the compound (B) having vinyl ether groups is preferably used in an amount of generally 5–150 parts by weight, particularly 10–100 parts by weight, and more particularly 15 to 70 parts by weight, per 100 parts by weight of the polymer (A). The photochemically-acid-generating compound (C) is appropriately used in an amount of generally 0.1–40 parts by weight, particularly 0.2–20 parts by weight, and more particularly 1–10 parts by weight, per 100 parts by weight of the total of the polymer (A) and the compound (B) having vinyl ether groups.

The electrodeposition photoresist composition according to the second aspect of the present invention is a composition which comprises, as essential components, the above-mentioned four components, i.e., the carboxyl group-containing polymer (A'), the hydroxyphenyl group-containing polymer (A"), the compound (B) having vinyl ether groups and the photochemically-acid-generating compound (C), and which is dissolved or dispersed in an aqueous medium after the carboxyl group(s) in the polymer (A') is neutralized with a basic compound. The compounding ratio of the four components in the composition can be varied over a wide range depending upon the applications of the composition, etc. However, the polymers (A') and (A") may be used in proportions by weight, (A')/(A"), of generally 90/10 to 10/90, preferably 70/30 to 30/70, and more preferably 60/40 to 40/60. The compound (B) having vinyl ether groups is preferably used in an amount of generally 5–150 parts by weight, particularly 10–100 parts by weight, and more particularly 15 to 70 parts by weight, per 100 parts by weight of the total of the carboxyl group-containing polymer (A') and the hydroxyphenyl group-containing polymer (A"). The photochemically-acid-generating compound (C) is appropriately used in an amount of generally 0.1–40 parts by weight, particularly 0.2–20 parts by weight, and more particularly 1–10 parts by weight, per 100 parts by weight of the total of the carboxyl group-containing polymer (A'), the hydroxyphenyl group-containing polymer (A") and the compound (B) having vinyl ether groups.

The electrodeposition photoresist composition of the present invention may further comprise a sensitizing colorant, as necessary. The sensitizing colorant usable includes colorants of phenothiazine type, anthracene type, coronene type, benzanthracene type, perylene type, pyrene type, merocyanine type, ketocoumarin type and other types.

The amount of the sensitizing colorant used is not restricted strictly. Generally, the appropriate amount of the sensitizing colorant is 0.1–10 parts by weight, preferably 0.3–5 parts by weight, per 100 parts by weight of the polymer (A) or 100 parts by weight of the total of the polymer (A') and the polymer (A").

The electrodeposition photoresist composition of the present invention may also comprise a plasticizer (e.g., phthalic acid ester), a polyester resin, an acrylic resin, etc. in order to allow the resulting film to have flexibility, non-tackiness, etc. The amounts of these additives are not restricted strictly. However, the preferable amount of these additives are used in amounts generally no more than 50 parts by weight, particularly no more than 20 parts by weight, per 100 parts by weight of the total of the polymer (A), the compound (B) having vinyl ether groups and the photochemically acid-generating compound (C), or 100 parts by weight of the total of the polymer (A'), the polymer (A"), the compound (B) having vinyl ether groups and the photochemically-acid-generating compound (C).

The electrodeposition photoresist composition of the present invention may furthermore comprise a fluidity-controlling agent, a colorant (e.g., dye or pigment), etc. as necessary.

The electrodeposition photoresist composition of the present invention can be prepared by mixing the above-mentioned components alone or, as necessary, in a solvent, neutralizing the mixture with a basic compound, and then dissolving or dispersing the neutralized mixture in an aqueous medium.

The usable solvent is preferably a solvent which can dissolve the components of the composition and can dissolve the water in an amount of 10% by weight or more at normal temperature. Examples of the solvent include ketones such as acetone, methyl ethyl ketone and the like; alcohols such as methanol, ethanol, n-propanol, isopropanol, s-butanol, tert-butanol and the like; glycols such as ethylene glycol, propylene glycol and the like; glycol ethers such as monoether between such a glycol and an alcohol (e.g., methanol, ethanol, butanol, or the like) or diether between such a glycol and an alcohol (e.g., methanol, ethanol, butanol, or the like); and cyclic ethers such as dioxane, tetrahydrofuran and the like. These solvents can be used singly or in admixture of two or more so as to best meet the purpose.

The solvents are used in an amount of usually no more than 20 parts by weight, preferably no more than 15 parts by weight, per 100 parts by weight of the total of the polymer (A), the compound (B) having vinyl ether groups and the photochemically-acid-generating compound (C), or 100 parts by weight of the total of the polymer (A'), the polymer (A"), the compound (B) having vinyl ether groups and the photochemically-acid-generating compound (C).

Further, there can auxiliarily be used solvents having a solubility in water of not exceeding 10% by weight at normal temperature in order to adjust the voltage to be applied and film-formability at the time of electrodeposition coating (described later on).

Examples of such a solvent include ketones such as methyl isobutyl ketone, cyclohexanone, isophorone and the like; alcohols such as n-butanol, hexanol, octanol, benzyl alcohol and the like; glycols such as ethylene glycol, propylene glycol and the like; glycol ethers such as monoether between such a glycol and hexanol, octanol, phenol or the like or diether between such as a glycol and butanol, hexanol, octanol, phenol or the like; aromatic hydrocarbons such as toluene, xylene, alkylbenzenes; and aliphatic hydrocarbons having a boiling point of not lower than 80° C. These solvents can be used singly or in admixture of two or more.

These solvents are used in an amount of usually no more than 20 parts by weight, preferably no more than 15 parts by weight, per 100 parts by weight of the total of the polymer (A), the compound (B) having vinyl ether groups and the photochemically-acid-generating compound (C), or 100 parts by weight of the total of the polymer (A'), the polymer (A"), the compound (B) having vinyl ether groups and the photochemically-acid-generating compound (C).

The basic compound used in the neutralization includes, for example, amines such as triethylamine, diethylamine, dimethylethanolamine, diethanolamine and the like; and alkalis such as sodium hydroxide, potassium hydroxide and the like. These basic compounds may be used singly or in admixture of two or more. Usually, the preferable amount of the basic compound required for dissolving or dispersing the composition comprising the polymer (A) or the polymer (A') and the polymer (A"), the compound (B) having vinyl ether groups, and the photochemically-acid-generating compound (C), is generally 0.1–1 equivalent, particularly 0.2–0.7 equivalent, per equivalent of the carboxyl group.

The composition of the present invention can be prepared by a per se known method as by adding an aqueous medium to a mixture of the components such as the polymer (A), or the polymer (A') and the polymer (A"), the compound (B) having vinyl ether groups, the photochemically-acid-generating compound (C), and the neutralizer, and, as necessary, the above-described solvent, etc. while stirring the mixture. The solids content of the resulting compositions is not limited particularly, and usually it is preferably 0.5–50% by weight, particularly 5–20% by weight.

Formation of Pattern

Pattern formulation using the electrodeposition photoresist composition of the present invention can be conducted, for example, as described below.

First, the composition of the present invention is coated on a substrate having an electroconductive surface, for example, a copper-laminated substrate for printed circuit or the like by electrodeposition coating to a thickness of about 0.5–15 μm in terms of dry-film thickness. The electrodeposition coating is conducted by dipping an article to be coated as an anode in an electrodeposition bath comprising the composition of the present invention, connecting a direct current source to the anode, and applying current between the anode and cathode. Application of current can be conducted by a constant voltage method in which a constant voltage is applied, a constant current method in which current is applied at a constant current density or a combination method in which they are combined. Also, a method may be used in combination in which the voltage or current density is increased slowly at an initial stage to a predetermined value.

The resist film having the predetermined film thickness can be formed by applying a voltage of usually 5–250 V for 10 seconds to 5 minutes in the case of the constant voltage method or applying a current density of usually 5–100 mA/cm$^2$ for 5 seconds to 5 minutes in the case of the constant current method.

The thickness of the coating film by electrodeposition coating is not restricted strictly and can be varied depending on the intended application of the pattern formed. However, the appropriate film thickness is usually about 0.5–15 μm, particularly about 1–10 μm, in terms of dry-film thickness.

The composition-coated substrate is heated under the conditions of temperature and time under which a crosslinking reaction takes place substantially between (1) the polymer (A), or the polymer (A') and/or the polymer (A") and (2) the compound (B) having vinyl ether groups, for example, at about 60°–150° C. for about 1–30 minutes to allow the coating film on the substrate to crosslink and cure.

Then, the cured coating film on the substrate is irradiated image-selectively with an actinic ray, using a positive type photomask, a reduction projection aligner, a direct-drawing machine or the like. The actinic ray is selected depending upon, for example, the kind of the photochemically-acid-generating compound (C) used in the photosensitive composition and includes, for example, an electron beam, a monochromatic light having a wavelength of 200–600 nm and a mixed light thereof.

The substrate irradiated with an actinic ray is then heated under the conditions of temperature and time under which the crosslinked structure of said cured coating film is severed in the presence of the acid generated by the above irradiation with an actinic ray, for example, at about 60°–150° C. for about 1–30 minutes, whereby the crosslinked structure of the irradiated (exposed) portions of the cured coating film is severed substantially.

The thus treated substrate after heating irradiation-heating is treated with a developer, whereby a pattern can be formed on the substrate. As the developer, there can be used a liquid capable of dissolving the polymer (A) or the polymer (A'), for example, an aqueous solution of a water-soluble organic base [e.g., alkanolamine hydroxyammonium salt (e.g., tetraethylammonium hydroxide)] or an inorganic alkali (e.g., sodium hydroxide, sodium carbonate or sodium metasilicate).

These basic substances can be used singly or as a mixture of two or more. The preferable concentration of these substances is ordinarily 0.05–10% by weight, particularly 0.5–5% by weight.

The development can be conducted by a per se known method, for example, by dipping the substrate after heating-irradiation-heating, in the developer, or by spraying the developer onto the substrate. The substrate, on which a pattern has been formed, can be as necessary water-washed and/or heated for drying.

When the substrate is an etchable type, the exposed portions of the substrate may be removed with an appropriate etchant and, as necessary, the remaining coating film may be removed with an appropriate releasant to obtain a relief image, as in the case of the photosensitive composition-coated substrate.

The thus obtained pattern is very fine, has excellent contrast, and accordingly can be advantageously used in the production of printing plate requiring a fine image; relief; display; printed circuit board; etc.

With the photosensitive compositions of the present invention, the unirradiated portions of the resist film have a crosslinked structure. As a result, the unirradiated portions are highly resistant to the developer or the etchant used and the formed pattern has excellent precision, as compared with the case using conventional positive type photoresists. Therefore, the photosensitive compositions of the present invention are expected to have wide applications in the field of printed circuit board of fine pattern, precise processing of semiconductors (e.g., LSI), fine processing of metals, etc.

The present invention is hereinafter described more specifically by way of Examples. In the Examples, "part(s)" and "%" are by weight.

SYNTHESIS EXAMPLE 1

Synthesis of polymer A-1 having carboxyl groups

A mixture consisting of:

| | |
|---|---|
| acrylic acid | 216 parts |
| styrene | 500 parts |
| n-butyl methacrylate | 284 parts |
| azobisisobutyronitrile (AIBN) | 50 parts | was dropwise added, in 2 hours, to 600 parts of methoxy propanol being stirred at 80° C. The mixture was kept at that temperature for 2 hours to obtain a polymer A-1. Solid content=about 62.5%; carboxyl group content=3 moles/kg of polymer; aromatic ring content=34.6 parts by weight/100 parts by weight of polymer.

SYNTHESIS EXAMPLE 2

Synthesis of polymer A-2 having carboxyl groups

A mixture consisting of:

| | |
|---|---|
| acrylic acid | 288 parts |
| styrene | 300 parts |
| n-butyl acrylate | 255 parts |
| 2-hydroxyethyl acrylate | 157 parts |
| tert-butyl peroxybenzoate | 100 parts | was dropwise added, in 2 hours, to 1,000 parts of 2-butoxyethanol being stirred at 110° C. The mixture was kept at that temperature for 2 hours to obtain a polymer A-2. Solid content=about 50%; carboxyl group content=4 moles/kg of polymer; aromatic ring content=20.7 parts by weight/100 parts by weight of polymer.

SYNTHESIS EXAMPLE 3

Synthesis of polymer A-3 having carboxyl groups

A mixture consisting of:

| | |
|---|---|
| acrylic acid | 72 parts |
| stryene | 650 parts |
| ethyl acrylate | 100 parts |
| n-butyl acrylate | 178 parts |
| AIBN | 75 parts | was polymerized in the same manner as in Synthesis Example 1 to obtain a polymer A-3. Solid content=about 62.5%; carboxyl group content=1 mole/kg of polymer; aromatic ring content=45 parts by weight/100 parts by weight of polymer.

SYNTHESIS EXAMPLE 4

Synthesis of polymer A-4 having carboxyl groups and hydroxyphenyl groups

Into a flask were placed 600 parts of o-hydroxybenzoic acid, 900 parts of o-cresol, 1,145 parts of 30% formalin, 130 parts of deionized water and 6.5 parts of oxalic acid. The mixture was refluxed by heating, for 60 minutes. Thereto was added 13.5 parts of 15% hydrochloric acid. The resulting mixture was refluxed by heating, for 40 minutes. Thereto was added 400 parts of deionized water of 15° C. The contents in the flask were kept at about 50° C. to precipitate a resin. Thereto was added 400 parts of deionized water to wash the resin at 50° C. The aqueous layer was removed. The washing operation was repeated three times. The resulting resin was dried at about 120° C. under reduced pressure to obtain a novolac phenol resin (a polymer A-4). Molecular weight=about 650; carboxyl group content=2.8 moles/kg of polymer; hydroxyphenyl group content=5.4 moles/kg of polymer.

SYNTHESIS EXAMPLE 5

Synthesis of polymer A-5 having carboxyl groups and hydroxyphenyl groups

Into a flask were placed 200 parts of tetrahydrofuran, 65 parts of p-hydroxystyrene, 28 parts of n-butyl acrylate, 11 parts of acrylic acid and 3 parts of azobisisobutyronitrile. The gas inside the flask was replaced by nitrogen, after which the flask contents were heated at 100° C. for 2 hours with stirring. The reaction mixture was poured into 1,500 ml of toluene. The resulting precipitate was separated and dissolved in 300 ml of acetone. The solution was poured into 1,500 ml of toluene. The resulting precipitate was separated and dried at 60° C. under reduced pressure to obtain a polymer A-5. Molecular weight=about 5,200; acrylic acid/n-butyl acrylate/p-hydroxystyrene=17/37/50 (weight ratio); carboxyl group content=1.8 moles/kg of polymer; hydroxyphenyl group content=4.6 moles/kg of polymer.

SYNTHESIS EXAMPLE 6

Synthesis of polymer A-6 having carboxyl groups and hydroxyphenyl groups

Into a flask were placed 200 parts of tetrahydrofuran, 93.5 parts of p-hydroxystyrene, 6.5 parts of acrylic acid and 3 parts of azobisisobutyronitrile. The gas inside the flask was replaced by nitrogen and the flask contents were heated at 100° C. for 2 hours with stirring. The reaction mixture was poured into 1,500 ml of toluene. The resulting precipitate was separated and dissolved in 300 ml of acetone. The solution was poured into 1,500 ml of toluene. The resulting precipitate was separated and dried at 60° C. under reduced pressure to obtain a polymer A-6. Molecular weight=about 2,300; carboxyl group content=1.0 moles/kg of polymer; hydroxyphenyl group content=7.0 moles/kg of polymer.

SYNTHESIS EXAMPLE 7

Synthesis of polymer A-7 having hydroxyphenyl groups

Into a flask were placed 1,490 parts of o-cresol, 1,145 parts of 30% formalin, 130 parts of deionized water and 6.5 parts of oxalic acid. The mixture was refluxed by heating, for 60 minutes. Thereto was added 13.5 parts of 15% hydrochloric acid. The mixture was refluxed by heating, for 40 minutes. Thereto was added 400 parts of deionized water of about 15° C. The flask contents were kept at about 75° C. to precipitate a resin. Thereto was added a 35% aqueous sodium hydroxide solution for neutralization. Then, the aqueous layer was removed. To the resin layer was added 400 parts of deionized water to wash the resin at 75° C. The aqueous layer was removed. The washing operation was repeated twice. The resin was dried at about 120° C. under reduced pressure to obtain a novolac phenol resin (a polymer A-7). Molecular weight=about 600.

SYNTHESIS EXAMPLE 8

Synthesis of polymer A-8 having hydroxyphenyl groups

Into a flask were placed 60 parts of tetrahydrofuran, 21% parts of p-hydroxystyrene, 9 parts of n-butyl acrylate and 3 parts of azobisisobutyronitrile. The gas inside the flask was replaced by nitrogen, and the flask contents were heated at 100° C. for 2 hours with stirring. The reaction mixture was poured into 700 ml of toluene. The resulting precipitate was separated and dissolved in 100 ml of acetone. The solution was poured into 700 ml of toluene. The resulting precipitate was separated and dried at 60° C. under reduced pressure to obtain a polymer A-8. Molecular weight=about 14,000; n-butyl acrylate/p-hydroxystyrene=35/65 (weight ratio).

SYNTHESIS EXAMPLE 9

Synthesis of polymer A-9 having hydroxyphenyl groups

The procedures of Synthesis Example 8 were repeated except that 30 parts of p-hydroxystyrene was used as the polymerizable monomer to obtain polymer A-9 which is a homopolymer of p-hydroxystyrene. Molecular weight= about 3,500.

SYNTHESIS EXAMPLE 10

Synthesis of vinyl ether compound B-1

Into a 250-ml flask were placed 45.6 g of bisphenol A, 80 ml of 2-chloroethyl vinyl ether and 100 ml of toluene. The gas inside the flask was replaced by nitrogen. 20 g of sodium hydroxide was added. The mixture was heated at 80° C. for 30 minutes. Then, there was added a solution of 4.56 g of tetrabutylammonium bromide in 20 ml of 2-chloroethyl vinyl ether. The mixture was heated at 95° C. for 5 hours for a reaction. The reaction mixture was washed with deionized water three times. The organic layer was separated and subjected to distillation to remove unreacted 2-chloroethyl vinyl ether and toluene to obtain a vinyl ether compound B-1. This compound had two vinyl ether groups in the molecule.

SYNTHESIS EXAMPLE 11

Synthesis of vinyl ether compound B-2

Into a flask were placed 1,490 parts of o-cresol, 1,145 parts of 30% formalin, 130 parts of deionized water and 6.5 parts of oxalic acid. The mixture was refluxed by heating, for 60 minutes. Thereto was added 13.5 parts of 15% hydrochloric acid. The mixture was refluxed by heating, for 40 minutes. Thereto was added 400 parts of deionized water of about 15° C. The flask contents were kept at about 75° C. to precipitate a resin. Thereto was added a 35% aqueous sodium hydroxide solution for neutralization. Then, the aqueous layer was removed. To the resin layer was added 400 parts of deionized water to wash the resin at 75° C. The aqueous layer was removed. The washing operation was repeated twice. The resin was dried at about 120° C. under reduced pressure to obtain a novolac phenol resin. Molecular weight=about 600.

The operation of Synthesis Example 10 was repeated except that 45.6 g of bisphenol A was replaced by 15 g of the above-synthesized resin, to obtain a vinyl ether compound B-2. This compound has about three and half vinyl ether groups in the molecule.

SYNTHESIS EXAMPLE 12

Synthesis of vinyl ether compound B-3

875 parts of a 75% ethylene glycol dimethyl ether solution of a polyisocyanate obtained by reacting 1 mole of trimethylolpropane with 3 moles of tolylene diisocyanate was reacted with 264 parts of 2-hydroxyethyl vinyl ether in the presence of dibutyltin diacetate at 35° C. for 3 hours to obtain a vinyl ether compound B-3. This compound has three vinyl ether groups in the molecule. Solid content= about 81%.

EXAMPLE 1

A mixture consisting of:

| | |
|---|---|
| polymer A-1 (solids content: 62.5%) | 160 parts |
| vinyl ether compound B-1 | 70 parts |
| photochemically-acid-generating compound C-1 (see Note 1) | 10 parts |
| triethylamine | 15 parts | was dissolved in 250 parts of diethylene glycol dimethyl ether to obtain a solution, which was added slowly into 695 parts of deionized water while stirring to obtain an aqueous dispersion having a solids content of about 10%.

In an electrodeposition bath consisting of the resulting aqueous dispersion was dipped a substrate made of a polyamide on which a copper foil of 18 µm thick was laminated. This copper-laminated substrate was used as an anode and direct current at a current density of 40 mA/cm$^2$ was applied between the anode and the opposite electrode for 1 minute. Thereafter, the substrate was taken out of the bath and water-washed and dried at 100° C. for 10 minutes. The film thickness of the resulting film was 3.4 µm.

The thus obtained substrate was irradiated with an ultraviolet light of 356 nm with the exposure being changed gradiently, and then was heated at 120° C. for 20 minutes. The substrate after irradiation and heating was subjected to development with an aqueous solution containing 2.38% of tetramethylammonium hydroxide.

A curve of (a) yield of residual film after development to (b) exposure of ultraviolet light was prepared. From the curve was determined a γ value (see Note 2). The γ value was 10.0, which indicated very high contrast. There was neither decrease nor swelling of the unirradiated film portions.

A film was formed on a substrate made in the same manner and irradiated with an ultraviolet light of 365 nm at an exposure of 8 mJ/cm$^2$, through a pattern mask. The irradiated film was subjected to the same treatment as above, to form an image pattern of line/space=2/2 µm. The sectional shape of the image pattern was evaluated by the angle formed by the wafer surface and the wall surface of image pattern. The angle was 87° which indicated a very excellent pattern shape. The lowest exposure for image formation was 6 mJ/cm$^2$.

(Note 1) The following photochemically-acid-generating compound C-1 was used.

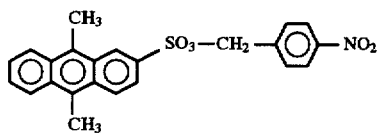

(Note 2) γ value: an index showing a contrast level. A higher γ value shows higher contrast. The measurement of γ value was conducted by the method described in "Photopolymer Handbook" pp. 101–103 (1989), edited by Photopolymer Conference and published by Kogyo Chosakai (Tokyo).

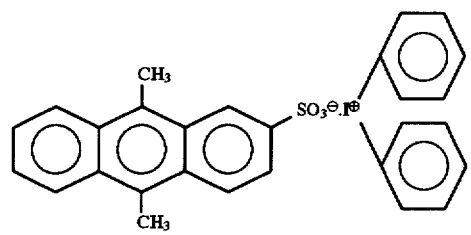

(Note 4) The following sensitizing colorant 1 was used.

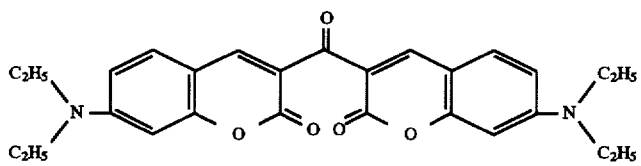

EXAMPLE 2

A mixture consisting of:

| | |
|---|---|
| polymer A-2 | 200 parts |
| vinyl ether compound B-2 | 25 parts |
| photochemically-acid-generating compound C-2 (see Note 3) | 8 parts |
| sensitizing colorant 1 (see Note 4) | 1 part |
| triethylamine | 10 parts | was dissolved in 200 parts of 2-butoxyethanol and 40 parts of benzyl alcohol and the resulting solution was added to 404 parts of deionized water in the same manner as in Example 1 to obtain an aqueous dispersion having a solids content of about 15%. Then, using a transparent electrode made of a glass plate on which indium tin oxide was deposited as a substrate, electrodeposition coating was conducted in the same manner as in Example 1 except that the current density was changed to 20 mA/cm$^2$. Thereafter, the thus-treated substrate was dried at 50° C. for 10 minutes. The film thickness obtained was 1.1 μm.

Then, an image pattern was formed in the same manner as in Example 1 except that the electrodeposition and drying were conducted under the same conditions as above, and the substrate was exposed with a visible light of 488 nm at an exposure of 3 mJ/cm$^2$ through a photomask for forming an image pattern of line/space=1/1, and the heating after irradiation was conducted under the conditions of 100° C. for 10 minutes. The shape of the resulting pattern was evaluated in the same manner as in Example 1. The angle was 89°, which indicated a very excellent pattern shape. The lower exposure for image formation was 2 mJ/cm$^2$. (Note 3) The following photochemically-acid-generating compound C-2 was used.

EXAMPLE 3

A mixture consisting of:

| | |
|---|---|
| polymer A-3 (solid content = 62.5%) | 160 parts |
| vinyl ether compound B-3 (solid content = 81%) | 20 parts |
| photochemically-acid-generating compound C-3 (see Note 5) | 5 parts |
| triethylamine | 8 parts | was dissolved in 100 parts of dimethoxydiethylene glycol and 30 parts of benzyl alcohol and the resulting solution was dispersed into 485 parts of deionized water in the same manner as in Example 1 to obtain an aqueous dispersion having a solid content of about 15%.

Then, a copper foil of 300 μm thick was placed in an electrodeposition bath consisting of the aqueous dispersion as an anode, and direct current of 40 V was applied for 1 minute between the anode and the opposite electrode. Thereafter, the substrate was taken out of the bath and water-washed, followed by drying at 110° C. for 10 minutes. The film thickness obtained was 1.3 μm.

The thus treated substrate was subjected to the same treatment as in Example 1 and measured for γ value. The γ value was 11.2 and was very high.

Next, a film was formed on the substrate in the same manner as above except that there was used a substrate made of a glass-reinforced epoxy resin plate of 1.6 mm thick, the substrate being clad with copper (copper thickness=45 μm) on each side, and provided with through holes of 0.3–0.6 mm in diameter whose inner wall was plated with copper, and that the time of application of voltage was 2.5 minutes. The film thickness obtained was 5.3 μm.

The substrate was irradiated with a light of 365 nm emitted from an ultrahigh-pressure mercury lamp, at an exposure of 12 mJ/cm$^2$ through a photomask of line/space= 50/50 μm. The resulting substrate was heated at 130° C. for 15 minutes. The substrate after heating was subjected to development with a 3% aqueous sodium carbonate solution; then, the exposed copper was etched with copper chloride;

thereafter, the remaining film on the substrate was removed with a 3% aqueous sodium hydroxide solution; thereby, a relief image was obtained. The copper plating in the through hole portion was protected completely and an excellent etching pattern was formed on the substrate.

(Note 5) The photochemically-acid-generating compound C-3 was used.

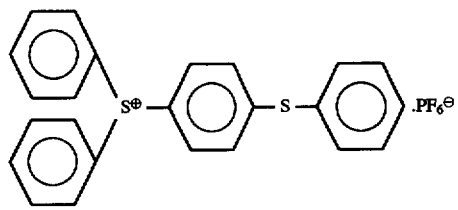

EXAMPLE 4

Test on storage stability

The dispersions of Examples 1–3 were charged in vessels, respectively, and the vessels were sealed and left to stand at 40° C. for 3 months. After the standing, the dispersions showed no precipitation nor separation, which indicated excellent stability. The tests in the respective Examples were repeated using the dispersions after the storage, and as a result, there was observed almost no change in the characteristics.

EXAMPLE 5

A mixture consisting of:

| | |
|---|---|
| polymer A-4 | 100 parts |
| vinyl ether compound B-1 | 70 parts |
| photochemicaly-acid-generating compound C-1 | 10 parts |
| triethylamine | 10 parts | was dissolved in 150 parts of diethylene glycol dimethyl ether to obtain a solution, which was added slowly into into 1,460 parts of deionized water while stirring to obtain an aqueous dispersion having a solid content of about 10%.

In an electrodeposition bath consisting of the resulting aqueous dispersion was dipped a substrate made of a polyamide on which a copper foil of 18 μm thick was laminated. This copper-laminated substrate was used as an anode and direct current at a current density of 50 mA/cm² was applied between the anode and the opposite electrode for 1 minute. Thereafter, the substrate was taken out of the bath and water-washed and dried at 90° C. for 10 minutes. The film thickness of the resulting film was 3.4 μm.

The thus obtained substrate was irradiated with an ultraviolet light of 356 nm with the exposure being changed gradiently, and then was heated at 120° C. for 20 minutes. The substrate after irradiation and heating was subjected to development with an aqueous solution containing 2.38% of tetramethylammonium hydroxide.

The γ value obtained from a curve of yield of residual film after development to exposure of ultraviolet light was 10.1, which indicated very high contrast. There was observed neither decrease nor swelling of the unirradiated film portions.

A film was formed on a substrate made in the same manner and irradiated with an ultraviolet light of 365 nm at an exposure of 8 mJ/cm², through a pattern mask. The irradiated film was subjected to the same treatment as above, to form an image pattern of line/space=2/2. The sectional shape of the image pattern was evaluated by the angle formed by the wafer surface and wall surface of image pattern. The angle was 87°, which indicated a very excellent pattern shape. The lowest exposure for image formation was 6 mJ/cm².

EXAMPLE 6

A mixture consisting of:

| | |
|---|---|
| polymer A-5 | 100 parts |
| vinyl ether compound B-2 | 20 parts |
| photochemically-acid-generating compound C-2 | 7.5 parts |
| sensitizing colorant 1 | 1 part |
| triethylamine | 6 parts | was dissolved in 150 parts of 2-butoxyethanol and 25 parts of benzyl alcohol and the resulting solution was added to 547 parts of deionized water in the same manner as in Example 5 to obtain an aqueous dispersion having a solid content of about 15%. Then, using a transparent electrode made of a glass plate on which indium tin oxide was deposited as a substrate, electrodeposition coating was conducted in the same manner as in Example 5 except that the current density was changed to 20 mA/cm². Thereafter, the thus-treated substrate was dried at 50° C. for 15 minutes. The film thickness obtained was 1.5 μm.

Then, an image pattern was formed in the same manner as in Example 5 except the electrodeposition and drying were conducted under the same conditions as above, and the substrate was exposed with a visible light of 488 nm at an exposure of 3 mJ/cm² through a photomask for forming an image pattern of line/space=1/1, and the heating after irradiation was conducted under the conditions of 100° C. for 10 minutes. The shape of the resulting pattern was evaluated in the same manner as in Example 1. The angle was 89°, which indicated a very excellent pattern shape. The lowest exposure for image formation was 2 mJ/cm².

EXAMPLE 7

A mixture consisting of:

| | |
|---|---|
| polymer A-6 | 100 parts |
| vinyl ether compound B-3 (solid content = 81%) | 20 parts 20 parts |
| Photochemically-acid-generating compound C-3 | 5 parts |
| triethylamine | 8 parts | was dissolved in 100 parts of dimethoxydiethylene glycol and 50 parts of benzyl alcohol and the resulting solution was dispersed into 525 parts of deionized water in the same manner as in Example 5 to obtain an aqueous dispersion having a solid content of about 15%.

Then, a copper foil of 300 μm thick was placed in an electrodeposition bath consisting of the aqueous dispersion as an anode, and direct current of 65 V was applied for 1 minute between the anode and the opposite electrode. Thereafter, the substrate was taken out of the bath and water-washed, followed by drying at 110° C. for 10 minutes. The film thickness obtained was 4.5 μm.

The thus treated substrate was subjected to the same treatment as in Example 1 and measured for γ value. The γ value was 10.1 and was very high.

Next, a film was formed on the substrate in the same manner as above except that there was used a substrate made of a glass-reinforced epoxy resin plate of 1.6 mm thick, the substrate being clad with copper (copper thickness=45 µm) on each side, and provided with through holes of 0.3–0.6 mm in diameter whose inner wall was plated with copper, and that the time of application of voltage was 1.5 minutes. The film thickness obtained was 5.3 µm.

The substrate was irradiated with a light of 365 nm emitted from an ultrahigh-pressure mercury lamp, at an exposure of 12 mJ/cm$^2$ through a photomask which did not transmit light to the through hole portion but had a pattern of line/space=50/50 µm for the portion other than the non-through hole portion. The resulting substrate was heated at 100° C. for 15 minutes. The substrate after heating was subjected to development with a 3% aqueous sodium carbonate solution; then, the exposed copper was etched with copper chloride; thereafter, the remaining film on the substrate was removed with a 3% sodium hydroxide solution; thereby, an excellent relief pattern was formed on the substrate.

EXAMPLE 8

Test on storage stability

The dispersions of Examples 5–7 were charged in vessels, respectively, and the vessels were sealed and left to stand at 40° C. for 3 months. After the standing, the dispersions showed no precipitation nor separation, which indicated excellent stability. The tests in the respective Examples were repeated using the dispersions after the storage, and as a result, there was observed almost no change in the characteristics.

EXAMPLE 9

A mixture consisting of:

| | |
|---|---|
| polymer A-1 (solid content = 62.5%) | 160 parts |
| polymer A-7 | 70 parts |
| vinyl ether compound B-1 | 70 parts |
| photochemically-acid-generating compound C-1 | 10 parts |
| triethylamine | 20 parts | was dissolved in 300 parts of dimethoxydiethylene glycol and the resulting solution was dispersed into 1,870 parts of deionized water in the same manner as in Example 1 to obtain an aqueous dispersion having a solid content of about 10%.

Then, a polyimide film having laminated thereon a copper foil of 18 µm thick was placed in an electro-deposition bath consisting of the aqueous dispersion as an anode, and direct current of 50 V was applied for 1 minute between the anode and the opposite electrode. Thereafter, the substrate was taken out of the bath and water-washed, followed by drying at 100° C. for 10 minutes. The film thickness obtained was 3.1 µm.

The thus obtained substrate was irradiated with an ultraviolet light of 356 nm with the exposure being changed gradiently, and then was heated at 120° C. for 20 minutes. The substrate after irradiation and heating was subjected to development with an aqueous solution containing 2.38% of tetramethylammonium hydroxide.

The γ value obtained from a curve of yield of residual film after development to exposure of ultraviolet light was 10.1, which indicated very high contrast. There was observed neither decrease nor swelling of the unirradiated film portions.

A film was formed on a substrate made in the same manner and irradiated with an ultraviolet light of 365 nm at an exposure of 8 mJ/cm$^2$, through a pattern mask. The irradiated film was subjected to the same treatment as above, to form an image pattern of line/space=2/2. The sectional shape of the image pattern was evaluated by the angle formed by the wafer surface and wall surface of image pattern. The angle was 87°, which indicated a very excellent pattern shape. The lowest exposure for image formation was 6 mJ/cm$^2$.

EXAMPLE 10

A mixture consisting of:

| | |
|---|---|
| polymer A-2 (solid content = 50%) | 200 parts |
| polymer A-8 | 50 parts |
| vinyl ether compound B-2 | 25 parts |
| photochemically-acid-generating compound C-2 | 8 parts |
| sensitizing colorant 1 | 1 part |
| triethylamine | 15 parts | was dissolved in 200 parts of 2-butoxyethanol and 40 parts of benzyl alcohol and the resulting solution was added to 688 parts of deionized water in the same manner as in Example 9 to obtain an aqueous dispersion having a solid content of about 15%. Then, using a transparent electrode made of a glass plate on which indium tin oxide was deposited as a substrate, electrodeposition coating was conducted in the same manner as in Example 9 except that the current density was changed to 20 mA/cm$^2$. Thereafter, the thus-treated substrate was dried at 50° C. for 15 minutes. The film thickness obtained was 1.3 µm.

Then, the substrate was exposed with a visible light of 488 m and the γ value was obtained in the same manner as in Example 9 except that the heating after irradiation was conducted under the condition of 100° C. for 10 minutes and the γ value was obtained. The γ value obtained was 10.8, which indicated a very high contrast. There was observed no decrease nor swelling of unexposed portions.

Then, the shape of the resulting pattern was evaluated in the same manner as in Example 9 except that irradiation was conducted with a visible light of 488 nm using a photomask of line/space=1/1 µm at an exposure of 3 mJ/cm$^2$%. The angle was 89°, which indicated a very excellent pattern shape. The lowest exposure for image formation was 2 mJ/cm$^2$.

EXAMPLE 11

A mixture consisting of:

| | |
|---|---|
| polymer A-3 (solid content = 62.5%) | 160 parts |
| polymer A-9 | 30 parts |
| vinyl ether compound B-3 (solid content = 81%) | 20 parts |
| photochemically-acid-generating compound C-3 | 5 parts |
| triethylamine | 10 parts | was dissolved in 150 parts of dimethoxydiethylene glycol and 50 parts of benzyl alcohol and the resulting solution was dispersed into 608 parts of deionized water in the same manner as in Example 9 to obtain an aqueous dispersion having a solid content of about 15%.

Then, a copper foil of 300 µm thick was placed in an electrodeposition bath consisting of the aqueous dispersion as an anode, and direct current of 55 V was applied for 1 minute between the anode and the opposite electrode. Thereafter, the substrate was taken out of the bath and water-washed, followed by drying at 110° C. for 10 minutes. The film thickness obtained was 2.3 μm.

The thus treated substrate was subjected to the same treatment as in Example 9 and measured for γ value. The γ value was 10.5 and was very high.

Next, a film was formed on the substrate in the same manner as above except that there was used a substrate made of a glass-reinforced epoxy resin plate of 1.6 mm thick, the substrate being clad with copper (copper thickness=45 μm) on each side, and provided with through holes of 0.3–0.6 mm in diameter whose inner wall was plated with copper, and that the time of application of voltage was 2.5 minutes. The film thickness obtained was 5.3 μm.

The substrate was irradiated with a light of 365 nm emitted from an ultrahigh-pressure mercury lamp, at an exposure of 12 mJ/cm² through a photomask which did not transmit light to the through hole portion but had a pattern of line/space=50/50 μm for the portion other than the non-through hole portion. The resulting substrate was heated at 100° C. for 15 minutes. The substrate after heating was subjected to development with a 3% aqueous sodium carbonate solution; then, the exposed copper was etched with copper chloride; thereafter, the remaining film on the substrate was removed with a 3% sodium hydroxide solution; thereby, an excellent relief pattern was formed on the substrate.

EXAMPLE 12

Test on storage stability

The dispersions of Examples 9–11 were charged in vessels, respectively, and the vessels were sealed and left to stand at 40° C. for 3 months. After the standing, the dispersions showed no precipitation nor separation, which indicated excellent stability. The tests in the respective Examples were repeated using the dispersions after the storage, and as a result, there was observed almost no change in the characteristics.

COMPARATIVE EXAMPLE 1

A mixture consisting of:

| | |
|---|---|
| acrylic acid | 288 parts |
| styrene | 300 parts |
| n-butyl acrylate | 300 parts |
| 2-hydroxyethyl acrylate | 112 parts |
| tert-butyl peroxybenzoate | 100 parts | was dropwise added, in 2 hours, to 1,000 parts of 2-butoxyethanol being stirred at 110° C. The mixture was kept at that temperature for 2 hours to obtain a carboxyl group-containing polymer 1. Solid content=about 50%, carboxyl group content=4 moles/kg of polymer; aromatic ring content=20.7 parts by weight/100 parts by weight of polymer.

The following materials:

| | |
|---|---|
| polymer 1 (solid content = 50%) | 200 parts |
| photosensitizer 1 (see Note 6) | 30 parts |
| benzyl alcohol | 15 parts |
| methoxypropanol | 75 parts |
| triethylamine | 12 parts | was mixed and dissolved, and the resulting solution was added into 535 parts of deionized water slowly to obtain an aqueous dispersion having a solid content of about 15%.

The γ value was measured in the same manner as in Example 1 except that the current density was 50 mA/cm² (film thickness=2.5 μm). The γ value obtained was 2.5. The γ value was 2.5, and the unirradiated film portions were dissolved by about 25% when the irradiated film portions were completely dissolved.

The developer was changed to a 0.5% aqueous sodium carbonate solution and a γ value was measured in the same manner. The γ value was 3.4, and the unirradiated film portions were dissolved by about 2% when the irradiated film portions were completely dissolved.

A pattern was formed on the above obtained substrate in the same manner as in Example 1 except that the exposure was changed to 80 mJ/cm² and the developer was changed to a 0.54 aqueous sodium carbonate solution. The sectional shape of the pattern was observed. The angle between the substrate and the pattern was 79°. In this Example, no image pattern could be formed when the exposure was 60 mJ/cm² or less.

(Note 6) The following photosensitizer 1 was used.

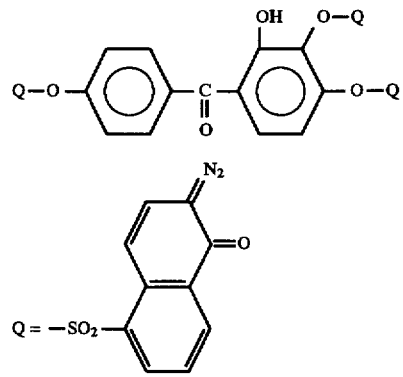

COMPARATIVE EXAMPLE 2

In a flask were charged 600 parts of o-hydroxybenzoic acid, cresol, 900 parts of o-cresol, 1,145 parts of 30% formalin, 130 parts of deionized water, and 6.5 parts of oxalic acid. The mixture was refluxed by heating, for 60 minutes. Thereto was added 13.5 parts of 15% hydrochloric acid. The mixture was refluxed by heating for 40 minutes. Thereto was added 400 parts of deionized water of about 15° C. The flask contents were kept at about 50° C. to precipitate a resin. Thereto was added a 35% aqueous sodium hydroxide solution to conduct neutralization. The aqueous layer was removed. To the resin layer was added 400 parts of deionized water, and the resin was washed at 50° C. Then, the aqueous layer was removed. The washing operation was repeated three times. The resulting resin was dried at about 120° C. under reduced pressure to obtain a novolac phenol resin (a polymer 2) having a molecular weight of about 650.

The following materials:

| | |
|---|---|
| polymer 2 | 100 parts |
| photosensitizer 1 | 30 parts |
| benzyl alcohol | 100 parts |
| ethylene glycol monoethyl ether | 100 parts |
| triethylamine | 15 parts | was mixed and dissolved, and the resulting solution was added into 522 parts of deionized water slowly with stirring to obtain an aqueous dispersion having a solid content of about 15%.

The γ value was measured in the same manner as in Example 1 except that the current density was 50 mA/cm² (film thickness=1.8 μm). The γ value obtained was 4.2, and the unirradiated film portions were dissolved by about 6% when the irradiated film portions were completely dissolved.

A pattern was formed on the above obtained substrate in the same manner as in Example 1 except that the exposure was changed to 80 mJ/cm² and the sectional shape of the pattern was observed. The angle between the substrate and the pattern was 82°. In this Example, no image pattern could be formed when the exposure was 70 mJ/cm² or less.

COMPARATIVE EXAMPLE 3

Test on storage stability

The dispersions of Comparative Examples 1 and 2 were charged in vessels, respectively, and the vessels were sealed and left to stand at 40° C. for 1 month when the state of the dispersions was observed. The both dispersions showed considerable precipitation and separation of liquid.

What we claimed is:

1. A process for resist pattern formation, which comprises conducting sequentially:
   (i) a step of electrodepositing a coating on an electroconductive surface of a substrate a positive electrodeposition photoresist composition comprising, as essential components:
      (A) 100 parts by weight of a polymer having carboxyl group(s) in an amount of 0.5 to 10 equivalents per kg of the polymer and optionally having hydroxyphenyl group(s) in an amount of at least 1 equivalent per kg of the polymer;
      (B) 5 to 150 parts by weight of a compound having at least 2 vinyl ether groups per molecule; and
      (C) 0.1 to 40 parts by weight, per 100 parts by weight of the sum of polymer (A) and the vinyl ether group-containing compound (B), of a compound which generates an acid when irradiated with an actinic ray, said composition being dissolved or dispersed in an aqueous medium by neutralizing the carboxyl group(s) in the polymer (A) with a basic compound,
   (ii) a step of heating the coated substrate,
   (iii) a step of irradiating the resulting substrate selectively with an actinic ray,
   (iv) a step of heating the irradiated substrate, and
   (v) a step of subjecting the resulting substrate to development with a basic developer.

2. A process as set forth in claim 1, wherein the polymer (A) has carboxyl group(s) of 0.7–5 equivalents per kg of the polymer.

3. A process as set forth in claim 1, wherein the polymer (A) has hydroxyphenyl group(s) of 2–8 equivalents per kg of the polymer.

4. A process as set forth in claim 1, wherein the polymer (A) has a number-average molecular weight of about 500 to about 100,000.

5. A process as set forth in claim 1, wherein the polymer (A) has a number-average molecular weight of about 1,500 to about 30,000.

6. A process as set forth in claim 1, wherein the polymer (A) has a glass transition temperature not lower than 0° C.

7. A process as set forth in claim 1, wherein the polymer (A) has a glass transition temperature of 5°–70° C.

8. A process as set forth in claim 1, wherein the compound (B) has, per molecule at least two vinyl ether groups each represented by a general formula —R—OCH=CH₂ wherein R represents a straight-chain or branched chain alkylene group of 1–6 carbon atoms.

9. A process as set forth in claim 1, wherein the compound (B) has two to four vinyl ether groups per molecule.

10. A process as set forth in claim 1, wherein the compound (B) having vinyl ether groups is a condensation product of a polyphenol compound and a halogenated alkyl vinyl ether, or a reaction product of an aromatic ring-containing polyisocyanate compound and a hydroxyalkyl vinyl ether.

11. A process as set forth in claim 1, which contains the compound (B) having vinyl ether groups in an amount of 10–100 parts by weight per 100 parts by weight of the polymer (A).

12. A process as set forth in claim 1, wherein the photochemically-acid-generating compound (C) is selected from the groups consisting of the compounds of the following formulae (I) to (XIV):

wherein Ar represents an aryl group and $X^\ominus$ represents $PF_6^\ominus$, $SbF_6^\ominus$ or $AsF_6^\ominus$,

wherein Ar and $X^\ominus$ have the same definitions as above,

wherein R represents an alkyl group of 1–12 carbon atoms or an alkoxy group of 1–12 carbon atoms; n represents 0–3; and $X^\ominus$ has the same definition as above,

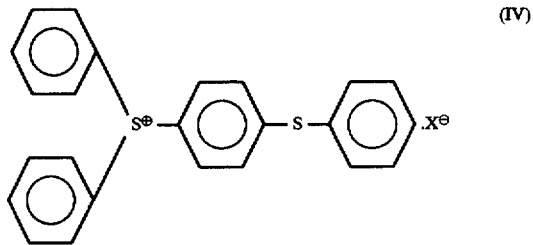

wherein $X^\ominus$ has the same definition as above,

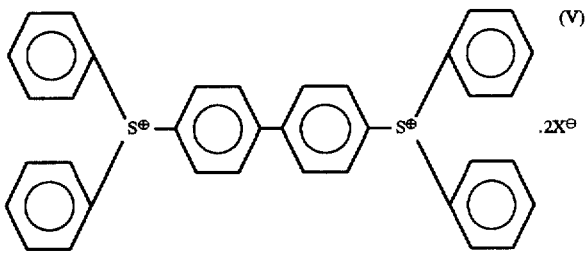

wherein X⊖ has the same definition as above,

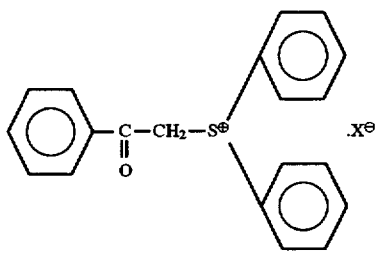 (VI)

wherein X⊖ has the same definition as above,

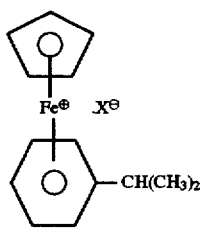 (VII)

wherein X⊖ has the same definition as above,

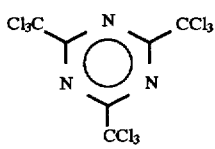 (VIII)

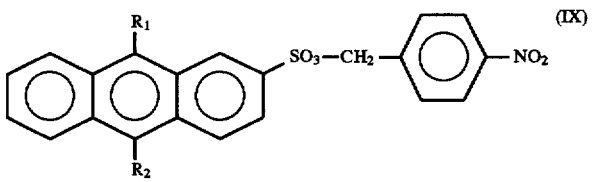 (IX)

wherein $R_1$ and $R_2$ independently represent an alkyl group of 1–12 carbon atoms or an alkoxy group of 1–12 carbon atoms,

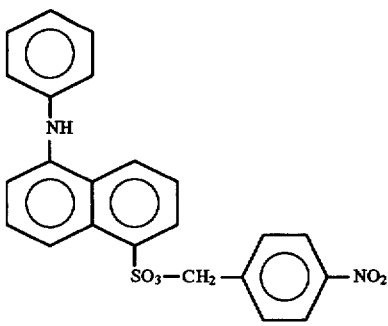 (X)

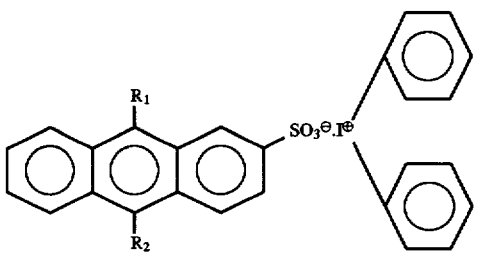 (XI)

wherein $R_1$ and $R_2$ have the same definitions as above,

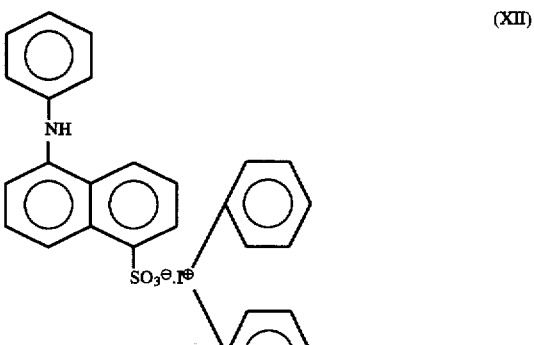 (XII)

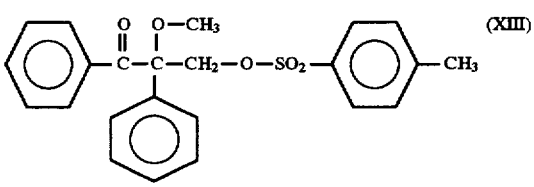 (XIII)

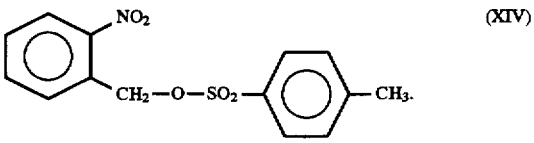 (XIV)

13. A process as set forth in claim 1, the composition comprising the photochemically-acid-generating compound (C) in an amount of 0.2–20 parts by weight per 100 parts by weight of the total of the polymer (A) and the compound (B) having vinyl ether groups.

14. A process as set forth in claim 1, the composition comprising a sensitizing colorant selected from the group consisting of colorants of a phenothiazine, an anthracene, a coronene, a benzanthracene, a perylene, a pyrene, a merocyanine, and a ketocoumarin in an amount of 0.1–10 parts by weight per 100 parts by weight of the polymer (A).

15. A process as set forth in claim 1, the composition comprising the sensitizing colorant in an amount of 0.3–5 parts by weight per 100 parts by weight of the polymer (A).

16. A process as set forth in claim 1, the composition comprising a solvent having a solubility in water at normal temperature of no less than 10% by weight in an amount of no more than 20 parts by weight per 100 parts by weight of the total of the polymer (A), the compound (B) having vinyl ether groups and the photochemically-acid-generating compound (C).

17. A process as set forth in claim 1, the composition comprising a solvent having a solubility in water at normal temperature of less than 10% by weight in an amount of no more than 15 parts by weight per 100 parts by weight of the total of the polymer (A), the compound (B) having vinyl ether groups and the photochemically-acid-generating compound (C).

18. A process as set forth in claim 1, in said composition had a solid content of 0.5–50% by weight.

19. A process for resist pattern formation, which comprises conducting sequentially:

(i) a step of electrodepositing a coating on an electroconductive surface of a substrate a positive electrodeposition photoresist composition comprising, as essential components:

(A') a polymer having carboxyl group(s);

(A") a polymer having hydroxyphenyl group(s);

(B) 5 to 150 parts by weight, per 100 parts by weight of the total of the polymer (A') and the polymer (A"), of a compound having at least 2 vinyl ether groups in the molecule;

(C) 0.1 to 40 parts by weight, per 100 parts by weight of the sum of the polymer (A'), the polymer (A") and the compound (B), of a compound which generates an acid when irradiated with an actinic ray, said composition being dissolved or dispersed in an aqueous medium by neutralizing the carboxyl group(s) in the polymer (A') with a basic compound, wherein the proportion by weight of the polymer (A')/the polymer (A") is within the range of 90/10 to 10/90, the carboxyl group content in a mixture consisting of the compounds (A'), (A"), (B) and (C) is within the range of 0.5 to 5 equivalents per kg of the mixture and the content of hydroxyphenyl group(s) in the mixture is within the range of 0.5 to 7 equivalents per kg of the mixture, (ii) a step of heating the coated substrate, (iii) a step of irradiating the resulting substrate selectively with an actinic ray, (iv) a step of heating the irradiated substrate, and (v) a step of subjecting the resulting substrate to development with a basic developer.

20. A process as set forth in claim 19, wherein the polymer (A') has carboxyl group(s) of 0.5–10 equivalents per kg of the polymer (A').

21. A process as set forth in claim 19, wherein the polymer (A') has carboxyl group(s) of 0.5–5.0 equivalents per kg of the polymer (A').

22. A process as set forth in claim 19, wherein the polymer (A') has a number-average molecular weight of about 3,000 to about 100,000.

23. A process as set forth in claim 19, wherein the polymer (A') has a number-average molecular weight of about 5,000 to about 30,000.

24. A process as set forth in claim 19, wherein the polymer (A') has a glass transition temperature not lower than 0° C.

25. A process as set forth in claim 19, wherein the polymer (A') has a glass transition temperature of 5°–70° C.

26. A process as set forth in claim 19, wherein the polymer (A") has hydroxyphenyl group(s) of 1.0–10 equivalents per kg of the polymer (A").

27. A process as set forth in claim 19, wherein the polymer (A") has hydroxyphenyl group(s) of 2–8 equivalents per kg of the polymer (A").

28. A process as set forth in claim 19, wherein the polymer (A") has a number-average molecular weight of about 500 to about 100,000.

29. A process as set forth in claim 19, wherein the polymer (A") has a number-average molecular weight of about 1,000 to about 30,000.

30. A process as set forth in claim 19, wherein the polymer (A") has a glass transition temperature not lower than 0° C.

31. A process as set forth in claim 19, wherein the polymer (A") has a glass transition temperature of 5°–70° C.

32. A process as set forth in claim 19, wherein the compounding ratio of the polymer (A') and the polymer (A") is in the range of 70/30 to 30/70 in terms of the weight ratio of (A')/(A").

33. A process as set forth in claim 19, wherein the mixture consisting of the components (A') to (C) has carboxyl group(s) of 0.7–3 equivalents per kg of the mixture and hydroxyphenol group(s) of 1.5–3 equivalents per kg of the mixture.

34. A process as set forth in claim 19, wherein the compound (B) having vinyl ether groups has at least two vinyl ether groups each represented by general formula —R—OCH=CH$_2$ wherein R represents a straight-chain or branched chain alkylene group of 1–6 carbon atoms.

35. A process as set forth in claim 19, wherein the compound (B) having vinyl ether groups has two to four vinyl ether groups in the molecule.

36. A process as set forth in claim 19, wherein the compound (B) having vinyl ether groups is a condensation product of a polyphenol compound and a halogenated alkyl vinyl ether, or a reaction product of an aromatic ring-containing polyisocyanate compound and a hydroxyalkyl vinyl ether.

37. A process as set forth in claim 1, the composition comprising the compound (B) having vinyl ether groups, in an amount of 10–100 parts by weight per 100 parts by weight of the polymer (A).

38. A process as set forth in claim 19, wherein the photochemically-acid-generating compound (C) is selected from the group consisting of the compound of the following formulae (I) to (XIV):

   (I)

wherein Ar represents an aryl group and $X^\ominus$ represents $PF_6^\ominus$, $SbF_6^\ominus$ or $AsF_6^\ominus$,

   (II)

wherein Ar and $X^\ominus$ have the same definitions as above,

   (III)

wherein R represents an alkyl group of 1–12 carbon atoms or an alkoxy group of 1–12 carbon atoms; n represents 0–3; and $X^\ominus$ has the same definition as above,

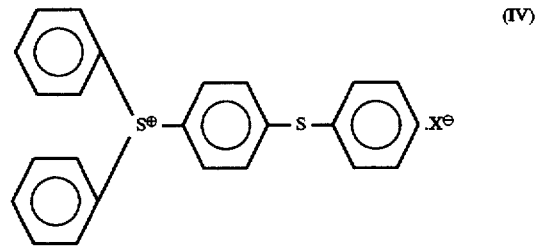   (IV)

wherein $X^\ominus$ has the same definition as above,

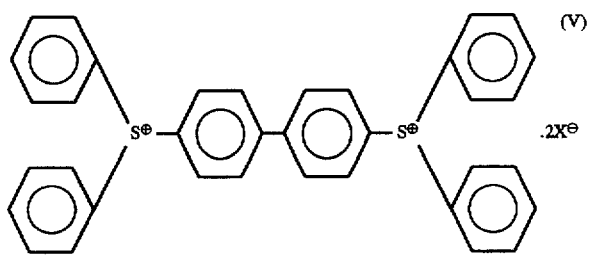   (V)

wherein $X^{\ominus}$ has the same definition as above,

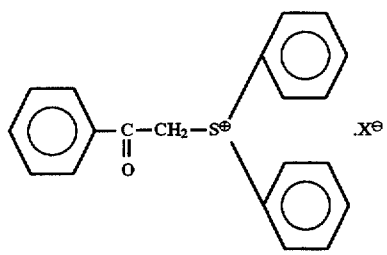
(VI)

wherein $X^{\ominus}$ has the same definition as above,

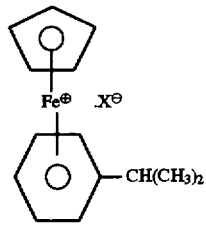
(VII)

wherein $X^{\ominus}$ has the same definition as above,

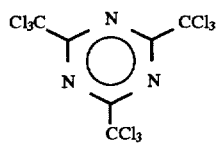
(VIII)

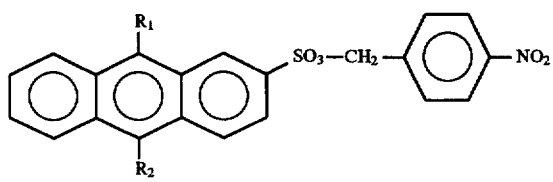
(IX)

wherein $R_1$ and $R_2$ independently represent an alkyl group of 1–12 carbon atoms or an alkoxy group of 1–12 carbon atoms,

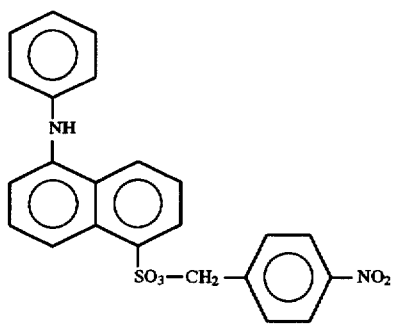
(X)

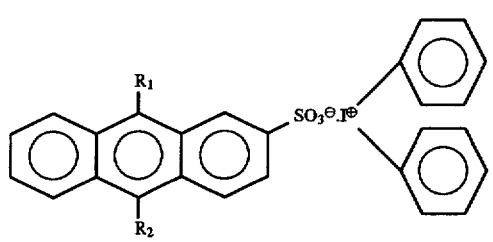
(XI)

wherein $R_1$ and $R_2$ have the same definitions as above,

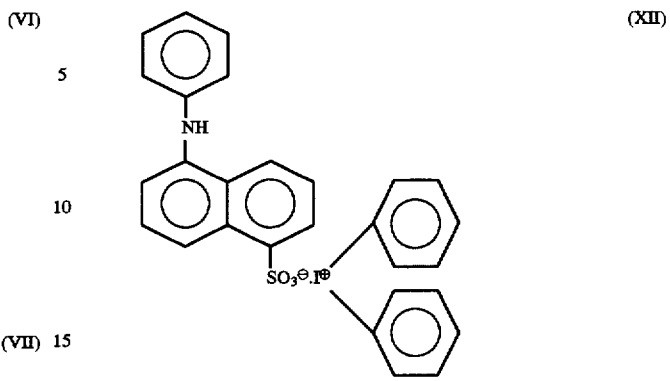
(XII)

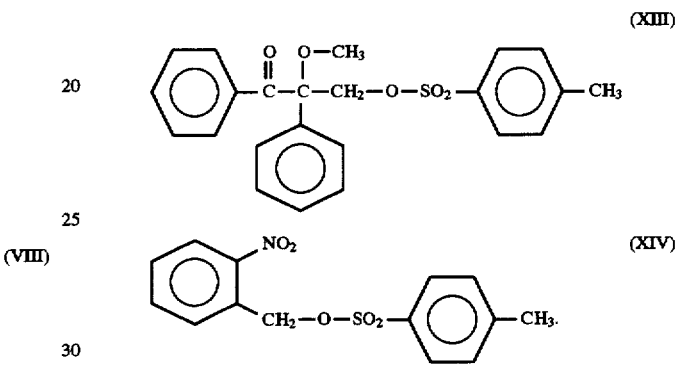
(XIII)

(XIV)

39. A process as set forth in claim 1, the composition comprising the photochemically-acid-generating compound (C) in an amount of 0.2–20 parts by weight per 100 parts by weight of the total of the polymer (A'), the polymer (A") and the compound (B) having vinyl ether groups.

40. A process as set forth in claim 1, the composition further comprising a sensitizing colorant selected from the group consisting of colorants of a phenothiazine, an anthracene, a coronene, a benzanthracene, a perylene, a pyrene, a merocyanine, and a ketocoumarin in an amount of 0.1–10 parts by weight per 100 parts by weight of the total of the polymer (A') and the polymer (A").

41. A process as set forth in claim 40, the composition comprising the sensitizing colorant in an amount of 0.3–5 parts by weight per 100 parts by weight of the total of the polymer (A') and the polymer (A").

42. A process as set forth in claim 19, comprising a solvent having a solubility in water at normal temperature of no less than 10% by weight in an amount of no more than 20 parts by weight per 100 parts by weight of the total of the polymer (A'), the polymer (A"), the compound (B) having vinyl ether groups and the photochemically-acid-generating compound (C).

43. A process as set forth in claim 42, the composition comprising a solvent having a solubility in water at normal temperature of less than 10% by weight in an amount of no more than 15 parts by weight per 100 parts by weight of the total of the polymer (A'), the polymer (A"), the compound (B) having vinyl ether groups and the photochemically-acid-generating compound (C).

44. A process as set forth in claim 19, wherein said composition had a solid content of 0.5–50% by weight.

* * * * *